United States Patent
Song et al.

(10) Patent No.: US 6,882,676 B2
(45) Date of Patent: Apr. 19, 2005

(54) FIBER-GRATING SEMICONDUCTOR LASER WITH TUNABILITY

(75) Inventors: Hyun Woo Song, Daejon (KR); Je Ha Kim, Daejon (KR)

(73) Assignee: Electronics and Telecommunications Research Institute (KR)

( * ) Notice: Subject to any disclaimer, the term of this patent is extended or adjusted under 35 U.S.C. 154(b) by 383 days.

(21) Appl. No.: 10/109,764

(22) Filed: Mar. 29, 2002

(65) Prior Publication Data

US 2003/0108079 A1 Jun. 12, 2003

(30) Foreign Application Priority Data

Dec. 7, 2001 (KR) ........................................ 2001-77422

(51) Int. Cl.[7] .............................. H01S 3/08; H01S 3/30
(52) U.S. Cl. ............................. 372/102; 372/6; 372/92
(58) Field of Search ........................... 372/92, 97, 102, 372/6, 20; 385/37, 49

(56) References Cited

U.S. PATENT DOCUMENTS

| 4,914,665 A | | 4/1990 | Sorin | |
|---|---|---|---|---|
| 5,182,782 A | * | 1/1993 | Tabasky et al. | 385/89 |
| 5,384,799 A | * | 1/1995 | Osterwalder | 372/32 |
| 5,966,486 A | * | 10/1999 | Boudreau et al. | 385/90 |
| 5,999,671 A | * | 12/1999 | Jin et al. | 385/37 |
| 6,188,705 B1 | * | 2/2001 | Krainak et al. | 372/32 |
| 6,310,997 B1 | * | 10/2001 | Kato et al. | 385/37 |
| 6,480,513 B1 | * | 11/2002 | Kapany et al. | 372/20 |

FOREIGN PATENT DOCUMENTS

| JP | 2000-077794 | 3/2000 |
|---|---|---|
| JP | 2000-183445 | 6/2000 |

OTHER PUBLICATIONS

Compression–tuned single–frequency Bragg grating fiber laser by G.A. Ball et al.

* cited by examiner

Primary Examiner—Minsun Oh Harvey
Assistant Examiner—Phillip Nguyen
(74) Attorney, Agent, or Firm—Blakely Sokoloff Taylor & Zafman

(57) ABSTRACT

A fiber-grating semiconductor laser with tunability is provided, which varies a output wavelength easily. The fiber-grating semiconductor laser with tunability is the hybrid integrated module on a substrate. It consists of a semiconductor laser as a gain medium and a Bragg-grating-written fiber held in a wavelength-tuning unit. (deletion) The wavelength-tuning unit can apply compression or elongation in the fiber grating for wavelength tunability.

9 Claims, 6 Drawing Sheets

FIBER-GRATING SEMICONDUCTOR LASER WITH TUNABILITY

BACKGROUND OF THE INVENTION

1. Field of the Invention

The present invention relates to a fiber-grating semiconductor, and more particularly, to a fiber-grating semiconductor laser capable of varying the output wavelength by applying stress on a fiber grating as an external resonating mirror.

2. Description of the Related Art

A wavelength-tunable semiconductor laser is emerging as a backup light source indispensable for a Wavelength Division Multiplexing (WDM)-based multi-channel optical transmission system, and studies on applications of the light source have been under way. As a result of the studies, several tunable semiconductor lasers such as a sampled grating tunable semiconductor laser, a temperature-controlled distributed feedback semiconductor laser, a temperature-controlled fiber-grating semiconductor laser and an external cavity tunable semiconductor laser have been developed. The sampled grating tunable semiconductor laser uses the non-zeroth order operation of a distributed feedback laser diode based on a sampled grating. The temperature-controlled distributed feedback semiconductor laser and the fiber-grating semiconductor laser have the output-wavelength tunability by controlling the temperatures of their grating regions. The external-cavity wavelength-tunable semiconductor laser varies the output wavelength by rotating a bulk grating as an external resonating mirror.

However, the above tunable semiconductor lasers have the following problems.

First, the sampled-grating wavelength-tunable semiconductor laser is disadvantageous in that it is not easy to control the output wavelength linearly and maintain the output light power stably when varying the wavelength.

Second, the temperature-controlled distributed feedback semiconductor laser has a competitive edge in that it is low-priced and simple-structured. However, performances of the distributed feedback semiconductor laser are dependent on temperature and the speed for varying the wavelength is not fast.

Third, a temperature-controlled fiber-grating semiconductor laser is disadvantageous in terms of the temperature stability of the fiber grating and the speed for varying the wavelength.

Fourth, since the external-cavity wavelength-tunable semiconductor laser has already been commercialized, it stays ahead of the other tunable semiconductor lasers in terms of technological advancement. However, it is too big and costly.

That is, the existing four approaches to manufacturing of the tunable semiconductor laser has limits in satisfying all the requirements for easy wavelength tuning, stability, high speed and low cost.

SUMMARY OF THE INVENTION

To solve the above problem, it is the objective of the present invention to provide a wavelength-tunable semiconductor laser that can satisfy all the requirements for easy wavelength tuning, stability, speed and price.

A fiber-grating semiconductor laser with tunability according to one embodiment of the present invention consists of a semiconductor laser as a gain medium and a Bragg-grating-written fiber held in a wavelength-tuning unit. An output facet of the semiconductor laser is coupled with the end of the Bragg-grating-written fiber optically. The wavelength-tuning unit can apply compression or elongation of the fiber grating having a pre-defined bandwidth.

In addition, a fiber-grating semiconductor laser with tunability according to one embodiment of the present invention includes:

a semiconductor substrate for having the first section for accommodating a semiconductor laser diode and the second section for accommodating an optical fiber;

a semiconductor laser diode for being placed on the first section of the semiconductor substrate; and an optical fiber being placed on the second section of the semiconductor substrate, being coupled optically with an output part of the semiconductor laser diode and including a Bragg grating.

The Bragg grating of the optical fiber is compressed or elongated to vary the wavelength of the output light of the fiber-grating semiconductor laser diode.

The first section further includes alignment dams for aligning the semiconductor laser diode precisely on the lower side of the diode.

The second section has a line path, to divide the semiconductor substrate portion and the line path portion. The line path portion is movable within the reach of the line path and includes a body separated from the semiconductor substrate by a certain gap. The semiconductor substrate and the body corresponding to the second section have the first line groove and the second line groove facing the output unit of the semiconductor laser diode, to accommodate the optical fiber. The Bragg grating of the optical fiber is compressed or elongated as the body moves. The optical fiber is adhered to the first line groove and the second line groove. The laser further includes a cover plate for covering a necessary portion of the optical fiber on the second section.

The inner facet of the optical fiber, which faces the semiconductor laser diode, is tilted. The semiconductor laser diode has a spot-size-converter in the output region.

The laser further includes a wavelength-tuning unit for compressing or elongating the Bragg grating of the optical fiber in the second section. The wavelength-tuning unit further includes:

a shaft for pulling or pushing the body; and a supporter for supporting the shaft.

The shaft is connected to an electro-motor or an piezoelectric device and is rotated, elongated or compressed to pull or push the body

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Figure 1:
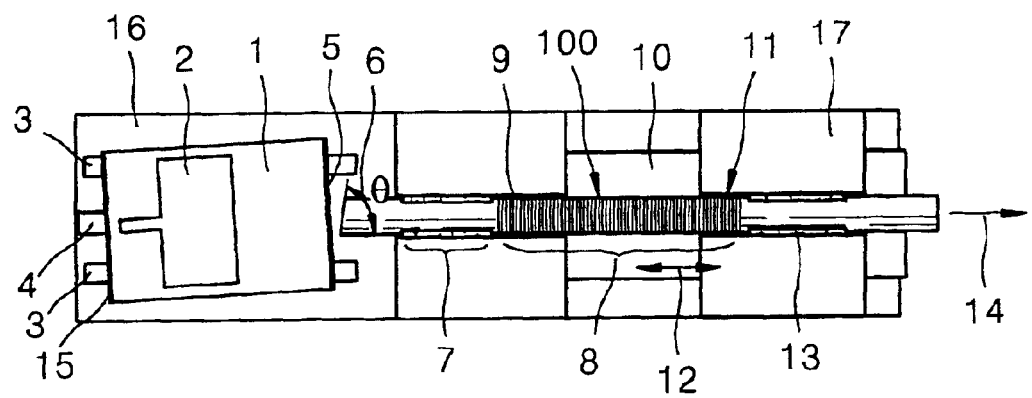
FIG. 1 is a top view of a wavelength-tunable fiber-grating semiconductor laser according to one embodiment of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. Therefore, configurations of elements in the drawings are exaggerated to highlight clearer descriptions and in the drawings, the same reference marks denote the same elements. In addition, if it is stated that a specific layer is on another layer or a semiconductor substrate, the specific layer may exist on the above another layer or the semiconductor substrate, or a third layer may be inserted between the specific layer and the above another layer or the semiconductor substrate.

Figure 2:
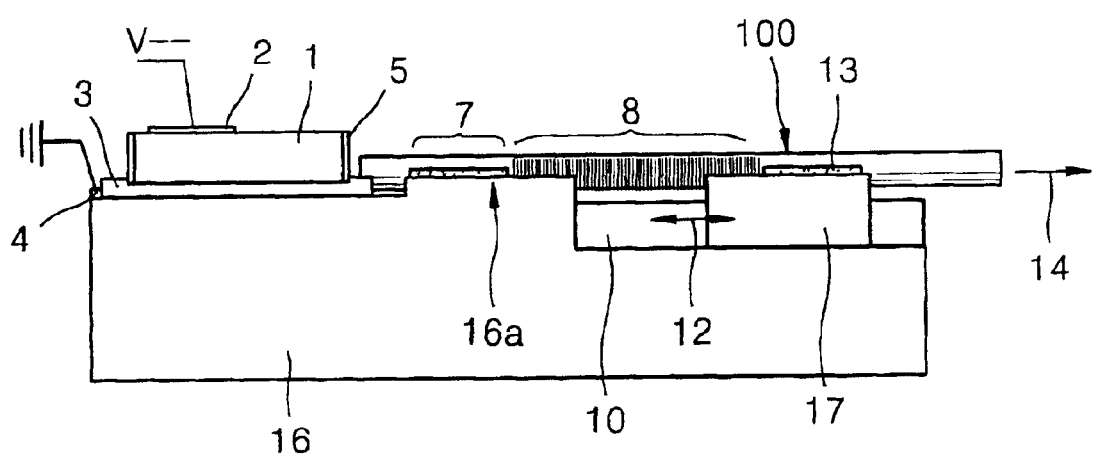
FIG. 2 is a side view of FIG. 1.
Figure 3:
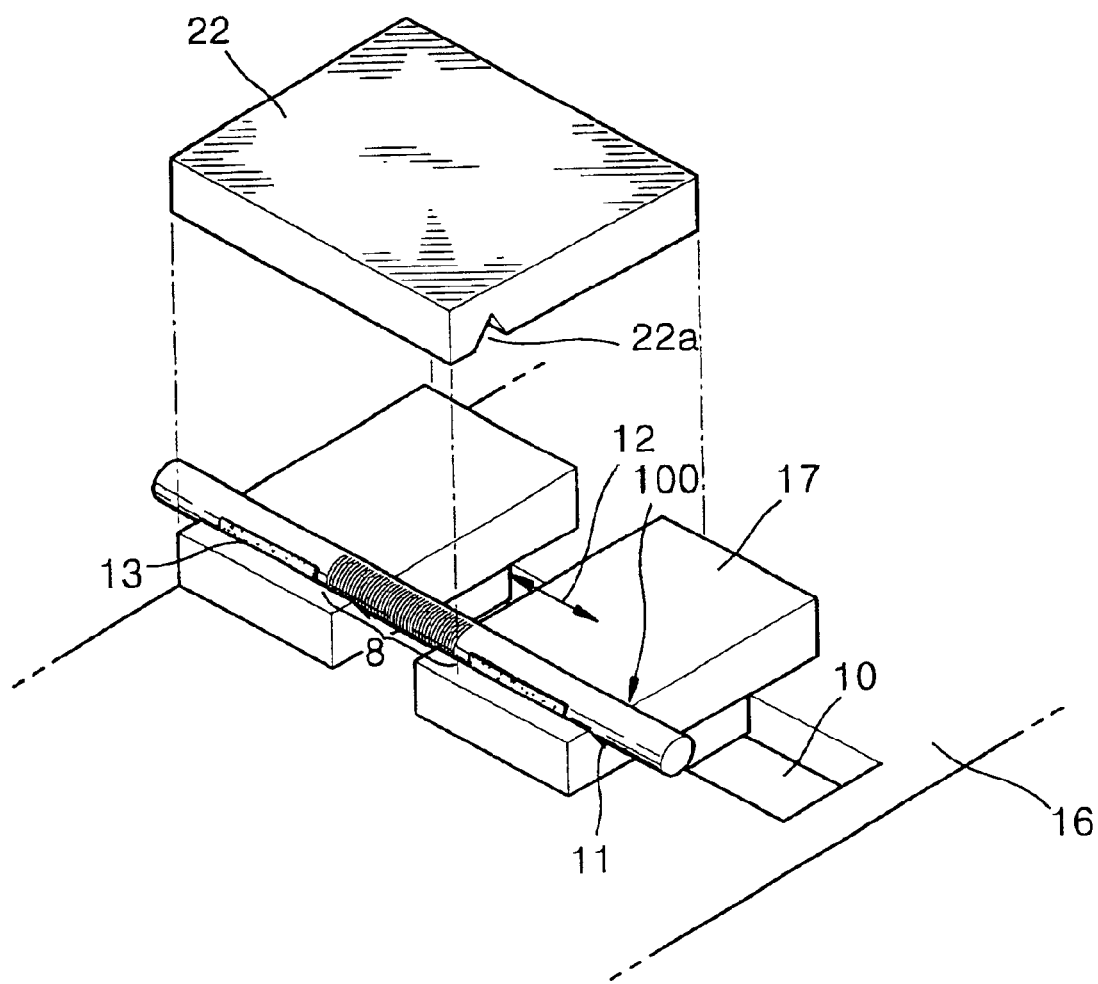
FIG. 3 is a perspective view of a wavelength-tuning unit where a fiber grating is placed in the fiber-grating semiconductor laser with tunability according to the embodiment of the present invention.
Figure 4A:
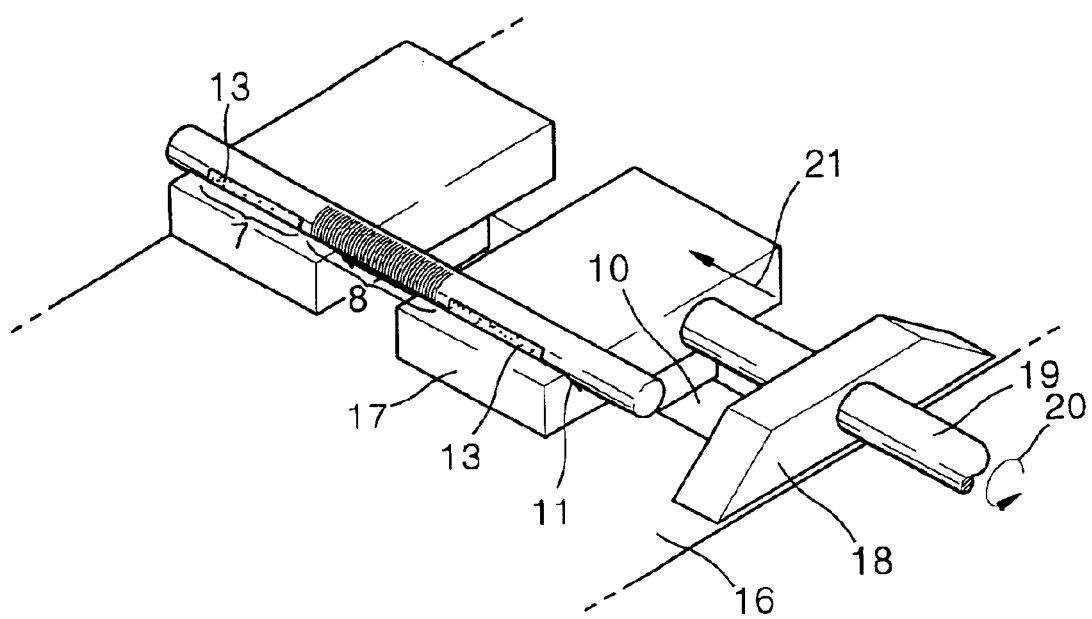
FIGS. 4A and 4B are perspective views showing the method of elongating/compressing the fiber grating in the fiber-grating semiconductor laser with tunability according to the present invention.
Figure 4B:
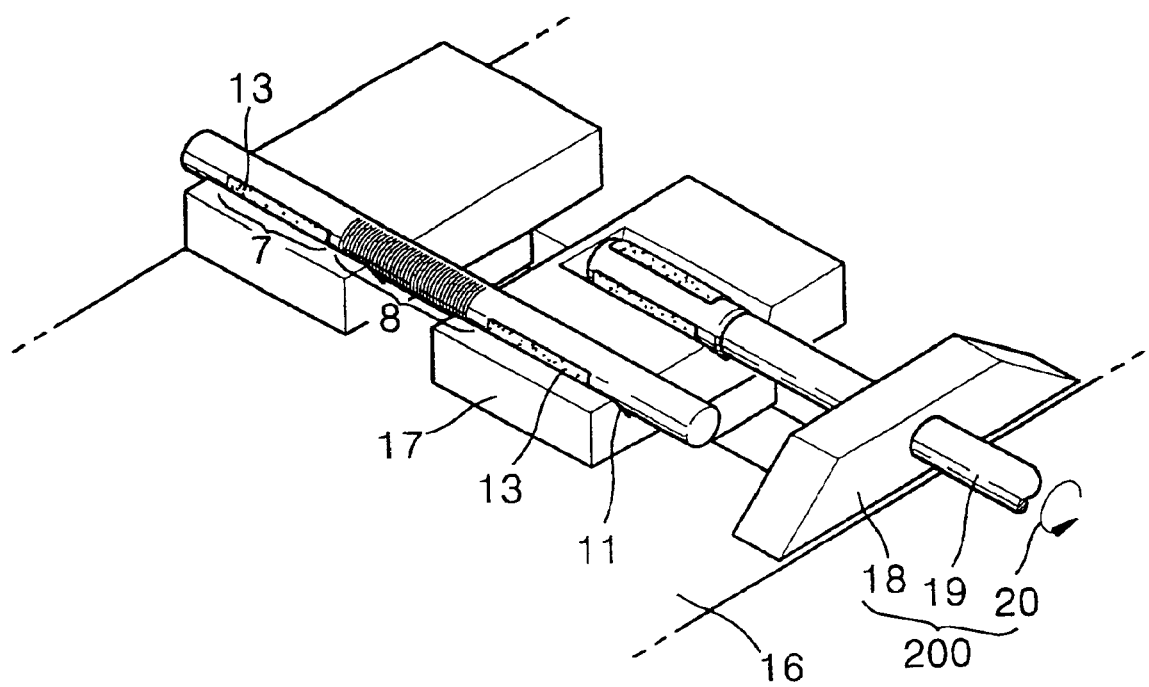
Figure 5:
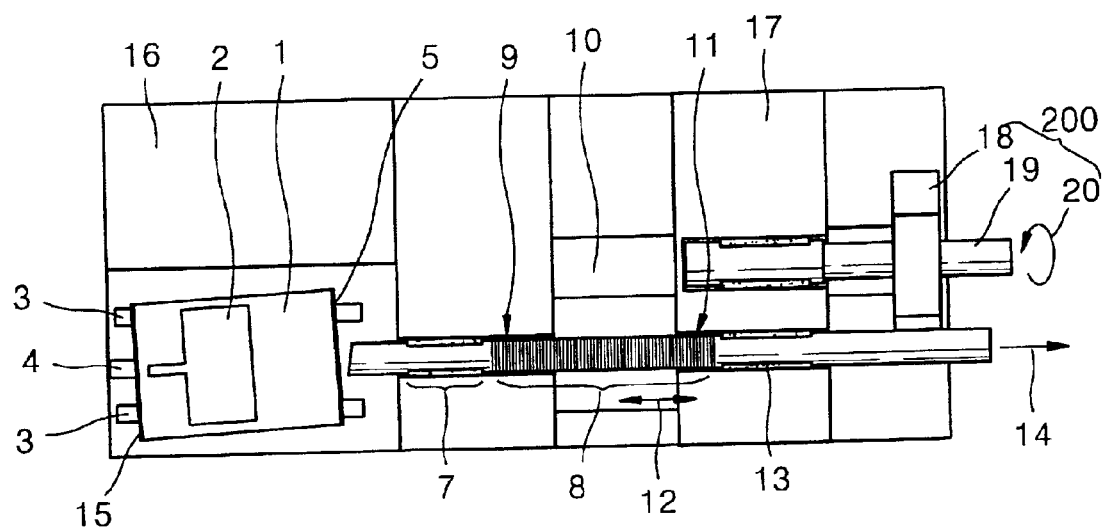
FIG. 5 is a top view of the fiber-grating semiconductor laser with tunability including the wavelength-tuning unit.
Figure 6:
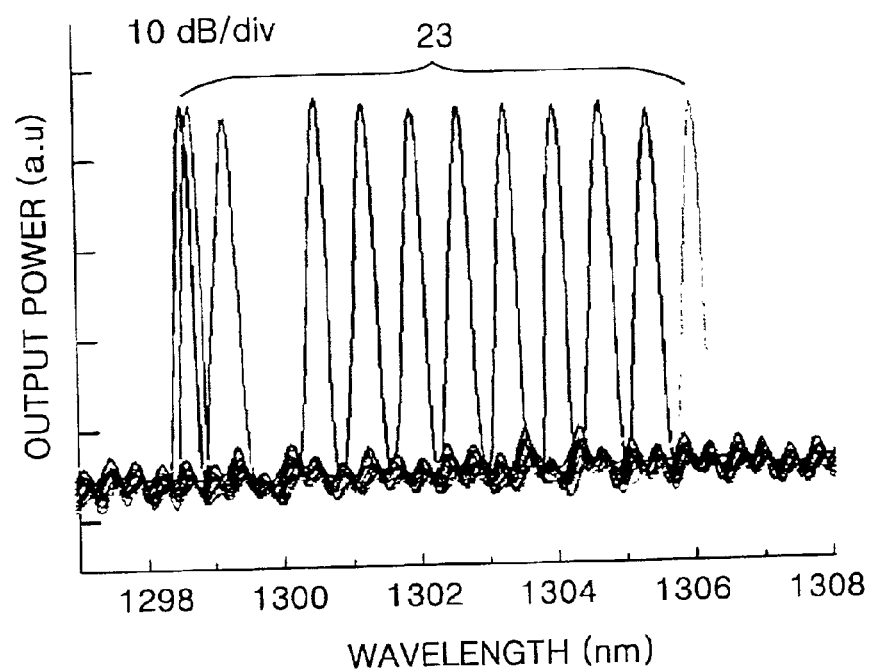
FIG. 6 is a graph showing an output light spectrum of the fiber-grating semiconductor laser with tunability according to the embodiment of the present invention.
Figure 7:
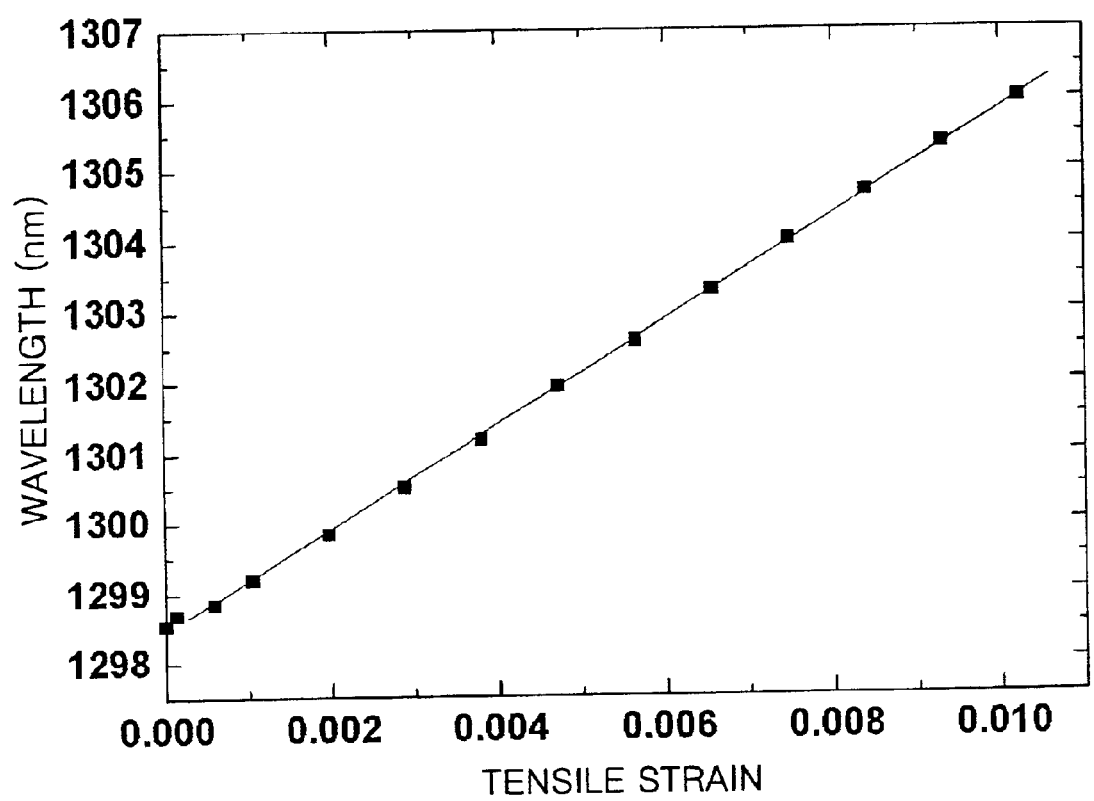
FIG. 7 is a graph showing the movement of the output wavelength caused by the elongation tuning in the fiber-grating semiconductor laser with tunability according to the embodiment of the present invention.

FIG. 1 is a top view of a wavelength-tunable fiber-grating semiconductor laser according to one embodiment of the present invention. FIG. 2 is a side view of FIG. 1. FIG. 3 is a perspective view of a wavelength-tuning unit where a fiber grating is placed in the fiber-grating semiconductor laser with tunability according to the embodiment of the present invention. FIGS. 4A and 4B are perspective views showing the method of elongating/compressing the fiber grating in the fiber-grating semiconductor laser with tunability according to the present invention. FIG. 5 is a top view of the fiber-grating semiconductor laser with tunability including the wavelength-tuning unit FIG. 6 is a graph showing an output light spectrum of the fiber-grating semiconductor laser with tunability according to the embodiment of the present invention. FIG. 7 is a graph showing the movement of the output wavelength caused by the elongation tuning in the fiber-grating semiconductor laser with tunability according to the embodiment of the present invention.

With reference to FIGS. 1 through 3, a substrate 16 is provided, which includes two sections where a semiconductor laser diode and an optical fiber are respectively placed. The substrate 16 may be a silicon substrate. On the semiconductor laser diode section, there are alignment dams 3 for facilitating the alignment of semiconductor laser diode elements to be mounted. The section, where there are the alignment dams 3 and the semiconductor laser diode is placed, is referred to as a "platform". The alignment dams 3 facilitate an optical connection between the waveguide of the semiconductor laser diode and that of the optical fiber. In addition, the alignment dams 3 enable the semiconductor laser diode elements having internal alignment grooves (or dams) to be precisely aligned. Meanwhile, there is a line path 10 on the other section of the substrate 16, where the optical fiber is placed. The line path 10 has a line groove that is relatively wide. That is, the optical fiber is placed on the substrate section 16a and the line path 10.

The semiconductor laser diode 1 is equipped on the platform of the substrate 16. The semiconductor laser diode 1 may be a simple semiconductor laser diode or a spot-size-converter integrated diode laser. If the spot-size-converter integrated diode laser is used, the efficiency of the optical coupling with the optical fiber can be enhanced without additional optical components. To operate the fiber-grating semiconductor laser diode, there are electrodes 2 and 4 on the upper part and the lower part of the semiconductor laser diode 1 respectively. The output (inner) facet of the semiconductor laser diode 1 (that is, on the part facing the optical fiber 100) is coated with thin films for antireflection 5. The outer facet of the semiconductor laser diode 1 (which is opposite to the inner facet where the antireflection coating thin film 5 is coated) is coated with thin films for high reflection 15.

There is the first line groove 9 on the substrate section 16a where the optical fiber is placed. Preferably, the first line groove 9 should be aligned to face the waveguide of the semiconductor laser diode 1. The cross section of the first line groove is V-shaped. In addition, the first line groove 9 should be large enough to accommodate the optical fiber. There is a body 17 on the section where the line path 10 is formed. The body 17 is designed to move within the reach of the line path 10. The body 17 includes the second line groove 11 designed to accommodate the optical fiber. The second line groove 11 also has the V-typed cross section and should be aligned opposite to the first line groove 9 formed on the substrate 16. The optical fiber 100 is placed on both the first line groove 9 of the substrate 16 and the second line groove 11 of the body 17. That is, one-end portion of the optical fiber 100 is placed on and supported by the first line groove 9 of the substrate 16. The other-end portion of the optical fiber 100 is placed on and supported by the second line groove 11 of the body which is separated from the substrate 16 by a certain gap. In addition, the optical fiber 100 should be aligned in such a way it can be coupled optically with the waveguide of the semiconductor laser diode 1. The optical fiber 100 has a Bragg grating 8. It is preferable that the Bragg grating 8 of the optical fiber 100 has a high reflectivity at the center wavelength and a narrow bandwidth (for example ~0.16 nm). In addition, an adhesive material 13 is used to fasten the optical fiber 100 firmly on the first line groove 9 and the second line groove 11.

The inner facet 6 of the optical fiber 100 can be tilted in order to reduce the reflection at the end facet of the optical fiber and improve the characteristics of the wavelength tuning. The tilted angle (θ) of the inner facet may be approximately 75° through 85°. The inner facet 6 of the optical fiber may be lens-typed. If the inner facet 6 of the optical fiber is lens-typed, the optical coupling between the semiconductor laser diode 1 and the optical fiber 100 is enhanced. As the body 17 moves, the Bragg grating 8 of the optical fiber 100 is compressed or elongated.

As shown in FIG. 3, on the optical fiber 100, there is a cover plate 22 that sheathes a certain part of the optical fiber 100. The cover plate 22 also has a line groove 22a that can accommodate the optical fiber 100, and can be fixed on either the first line groove 16a or the second line groove. Preferably, when the cover plate 22 is fixed, it covers the grating 8 of the optical fiber 100. The cover plate 22 can prevent the optical fiber 100 from being bent when the Bragg grating 8 of the optical fiber 100 is compressed.

In addition, referring to FIGS. 4A, 4B and 5, there is an apparatus 200 for varying the wavelength on the outer side of the body 17. The apparatus 200 moves the body 17 to compress or elongate the Bragg grating of the optical fiber.

An apparatus 200 includes a shaft 19 for moving the body 17 positioned on the line path 10 and a support 18 which supports the shaft 19. As shown in FIG. 4A, the shaft 19 is designed to push the sidewall of the body 17. In FIG. 4B, the shaft 19 accommodated in a specific part of the body 17 pulls or pushes the body 17. In addition, the shaft 19 can be connected to an electro-motor. In this case, the shaft 19 can be rotated in order to compress or elongate the Bragg grating in such a way the wavelength can move as much as the channel intervals of the multi-channel light source. Here, the reference number 20 indicates the rotation direction of the shaft 19. The reference number 21 indicates the compression direction of the Bragg grating of the optical fiber. The reference number 12 indicates the movement direction of the body 17 in FIG. 3.

The fiber-grating semiconductor laser operates as follows.

If the electrodes 2 and 4 of the semiconductor laser diode 1 apply voltages, currents flow in the semiconductor laser diode 1. Then, a fiber-grating semiconductor laser operates at the center wavelength of the Bragg grating 8 and the output light (laser) 14 is emitted through the outer facet of the optical fiber 100. That is, the Bragg grating 8 of the optical fiber in the fiber-grating semiconductor laser is used as an output mirror of the external resonator. Furthermore, the semiconductor laser diode 1 serves as a gain medium of the fiber-grating semiconductor laser according to the embodiment of the present invention. Then, the fiber-grating semiconductor laser operates at the reflection center wavelength of the Bragg grating 8 by dint of the difference of the gain/loss in the semiconductor laser diode 1. If the optical fiber including the Bragg grating 8 which is used as an output mirror is elongated or compressed, the wavelength of the laser operation becomes longer or shorter respectively That is, if the Bragg grating 8 is compressed or elongated, the refractive index distribution in the optical fiber is changed and the period of the Bragg grating 8 becomes shorter or longer. As a result, when a light beam is propagating in the optical fiber, the center wavelength of the reflected light becomes shorter or longer. If the Bragg grating 8 of the optical fiber, whose reflection wavelength is variable, is used as a reflection mirror (or output mirror) of the external resonator in the semiconductor laser diode, the laser whose wavelengths are variable can be obtained.

As described above, if the Bragg grating of the optical fiber (which has a high reflectivity and a narrow bandwidth at the desired wavelength) is used, output wavelength can be selected easily at the center wavelength of Bragg grating of the optical fiber.

As shown in FIG. 6, the side-mode suppression ratio of about 40 dB and the output line width of 1 MHz or less can be obtained. The stable output wavelength, which is not sensitive to the external temperature variations and the injection current, can be obtained. As shown in FIG. 7, when the Bragg grating of the optical fiber is elongated, the output wavelength is measured. In this case, the wavelength change by the elongation is about 0.68 nm/milli-strain when the Bragg grating of the optical fiber has the center wavelength of around 1.3 $\mu$m.

As shown in FIG. 4A, if the Bragg grating of the optical fiber is compressed, the wavelength can move up to as much as more than 35 nm in a stable manner. As shown in FIG. 4B, if the Bragg grating of the optical fiber is both compressed and elongated, the wavelength movement of about 40 nm or more can be obtained.

In addition, the shaft 19 can be rotated in order to compress or elongate the Bragg grating of the optical fiber in such a way the wavelength can move as much as the channel spacing of the multi-channel light source. The fiber-grating semiconductor laser with tunability can be used as a backup light source of the faulty channel of the multi-channel light sources.

According to the present invention, the optical fiber Bragg grating, which can vary the reflection wavelength by compression or elongation, is used as an output mirror of the fiber-grating semiconductor laser diode. Since the wavelength can be controlled by elongation and compression of the optical fiber Bragg grating without the need for temperature adjustment, the fiber-grating semiconductor laser with tunability according to the present invention is not sensitive to temperatures and low-priced. Besides, physically elongating and compressing the optical fiber enable the wavelength to vary at high speeds in a stable manner.

The fiber-grating semiconductor laser with tunability according to the present invention can be applicable to technologies related to a light source, an optical communication or a wavelength converter.

Although specific embodiments of the invention have been described herein for illustrative purposes, various modifications and equivalents thereof can be made without departing from the spirit and scope of the invention, as will be recognized by those skilled in the relevant art. Accordingly, the invention is not limited to the disclosure, but instead its scope is to be determined entirely by the following claims.

What is claimed is:

1. A fiber-grating semiconductor laser with tunability comprising:
    a substrate for having the first section for accommodating a semiconductor laser diode and the second section for accommodating an optical fiber,
    a semiconductor laser diode for being placed on the first section of the substrate; and
    an optical fiber being placed on the second section of the substrate, being coupled optically with an output facet of the semiconductor laser diode and including a Bragg grating,
    wherein the Bragg grating of the optical fiber is compressed or elongated to vary the wavelength of the output light of the fiber-grating semiconductor laser diode,
    wherein the second section has a line path, to divide the substrate portion and the line path portion, the line path portion is movable within the reach of the line path and includes a body separated from the substrate by a certain gap,
    wherein the substrate and the body corresponding to the second section have the first line groove and the second line groove facing the output facet of the semiconductor laser diode, to accommodate the optical fiber, and the Bragg grating of the optical fiber is compressed or elongated as the body moves.

2. The laser of claim 1, wherein the first section further comprises alignment dams for aligning the semiconductor laser diode precisely on the lower side of the diode.

3. The laser of claim 1, wherein the optical fiber is adhered to the first line groove and the second line groove.

4. The laser of claim 1 further comprising a cover plate for covering a selective portion of the optical fiber on the second section.

5. The laser of claim 1, wherein the inner facet of the optical fiber, which faces the semiconductor laser diode, is tilted.

6. The laser of claim 1, wherein the semiconductor laser diode has a spot-size-converter.

7. The laser of claim 1 further comprising a wavelength-tuning unit for compressing or elongating the Bragg grating of the optical fiber on the outer facet of the second section.

8. The laser of claim 7, wherein the wavelength-tuning unit further comprises:

a shaft for pulling or pushing the body; and a supporter for supporting the shaft.

9. The laser of claim 8, wherein the shaft is connected to an electro-motor and is rotated to pull or push the body.

* * * * *